(12) United States Patent
Bedeschi et al.

(10) Patent No.: US 9,437,294 B2
(45) Date of Patent: Sep. 6, 2016

(54) RESISTANCE VARIABLE MEMORY SENSING

(71) Applicant: Micron Technology, Inc., Boise, ID (US)

(72) Inventors: Ferdinando Bedeschi, Biassono (IT); Roberto Gastaldi, Agrate Brianza (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/717,784

(22) Filed: May 20, 2015

(65) Prior Publication Data

US 2015/0255152 A1 Sep. 10, 2015

Related U.S. Application Data

(63) Continuation of application No. 13/869,512, filed on Apr. 24, 2013, now Pat. No. 9,047,944.

(51) Int. Cl.
*G11C 13/00* (2006.01)

(52) U.S. Cl.
CPC ......... *G11C 13/004* (2013.01); *G11C 13/0033* (2013.01); *G11C 13/0069* (2013.01); *G11C 2013/0047* (2013.01); *G11C 2013/0076* (2013.01)

(58) Field of Classification Search
None
See application file for complete search history.

(56) References Cited

U.S. PATENT DOCUMENTS

| 7,136,300 | B2 | 11/2006 | Tran et al. |
| 7,436,698 | B2 | 10/2008 | Lin et al. |
| 8,238,145 | B2 | 8/2012 | Abedifard |
| 8,320,169 | B2 | 11/2012 | Zhu et al. |
| 2002/0126525 | A1 | 9/2002 | Weber et al. |
| 2002/0136076 | A1 | 9/2002 | Kleveland et al. |
| 2004/0076029 | A1* | 4/2004 | Jeong .............. G11C 11/16 365/50 |
| 2006/0044878 | A1 | 3/2006 | Perner |
| 2007/0091672 | A1* | 4/2007 | Lin ............... G11C 11/16 365/158 |
| 2007/0211524 | A1 | 9/2007 | Kurisu |
| 2010/0027328 | A1 | 2/2010 | Czubatyj et al. |
| 2010/0097849 | A1 | 4/2010 | Hwang et al. |
| 2010/0110768 | A1 | 5/2010 | Choi |

(Continued)

FOREIGN PATENT DOCUMENTS

| JO | 2007242118 | 9/2007 |
| JP | 2003510752 | 3/2003 |

(Continued)

OTHER PUBLICATIONS

Bedeschi, "Resistance Variable Memory Sensing," filed Apr. 24, 2013, (32 pgs.).

(Continued)

*Primary Examiner* — James G Norman
(74) *Attorney, Agent, or Firm* — Brooks, Cameron & Huebsch, PLLC

(57) ABSTRACT

The present disclosure includes apparatuses and methods for sensing a resistance variable memory cell. A number of embodiments include programming a memory cell to an initial data state and determining a data state of the memory cell by applying a programming signal to the memory cell, the programming signal associated with programming memory cells to a particular data state, and determining whether the data state of the memory cell changes from the initial data state to the particular data state during application of the programming signal.

19 Claims, 5 Drawing Sheets

(56) References Cited

U.S. PATENT DOCUMENTS

| | | |
|---|---|---|
| 2010/0110784 A1 | 5/2010 | Zheng et al. |
| 2010/0296331 A1 | 11/2010 | Ramani et al. |
| 2011/0134687 A1 | 6/2011 | Lee et al. |
| 2012/0106239 A1 | 5/2012 | Xi et al. |

FOREIGN PATENT DOCUMENTS

| | | |
|---|---|---|
| JP | 2006134400 | 5/2006 |
| JP | 2012518867 | 8/2012 |

OTHER PUBLICATIONS

International Search Report for related PCT Patent Application No. PCT/US2014/034139, dated Aug. 13, 2014, 14 pages.

Office Action for related Taiwan Patent Application No. 103114894, dated Sep. 22, 2015, 18 pages.

Notice of Rejection for related Japan Patent Application No. 2016-507905, dated Mar. 29, 2016, 14 pages.

Notice of Refusal for related Japan Patent Application No. 2016-507905, dated Jul. 5, 2016, 5 pages.

* cited by examiner

RESISTANCE VARIABLE MEMORY SENSING

PRIORITY INFORMATION

This application is a Continuation of U.S. application Ser. No. 13/869,512, filed Apr. 24, 2013, the contents of which are included herein by reference.

RELATED APPLICATIONS

The present application is related to U.S. patent application Ser. No. 13/869,571, filed on Apr. 24, 2013, entitled "Resistance Variable Memory Sensing.".

TECHNICAL FIELD

The present disclosure relates generally to apparatuses, such as semiconductor memory devices, systems, and controllers, and related methods, and more particularly, to sensing resistance variable memory cells.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), flash memory, and resistance variable memory, among others. Types of resistance variable memory include programmable conductor memory, phase change random access memory (PCRAM), resistive random access memory (RRAM), magnetoresistive random access memory (MRAM; also referred to as magnetic random access memory), conductive-bridging random access memory (CBRAM), and spin torque transfer random access memory (STT RAM), among others.

Non-volatile memory may be used in, for example, personal computers, portable memory sticks, solid state drives (SSDs), personal digital assistants (PDAs), digital cameras, cellular telephones, portable music players (e.g., MP3 players) and movie players, among other electronic devices. Data, such as program code, user data, and/or system data, such as a basic input/output system (BIOS), are typically stored in non-volatile memory devices.

Resistance variable memory, such as RRAM or STT RAM, includes resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying a programming signal to the resistance variable memory cells. Programming signals can include applying sources of an electrical field or energy, such as positive or negative electrical pulses (e.g., positive or negative voltage or current pulses) to the cells (e.g., to the memory element of the cells) for a particular duration.

A resistance variable memory cell can be programmed to one of a number of data states. For example, a single level cell (SLC) may be programmed to one of two data states, a low resistance state that corresponds to a set data state (e.g., logic 1), or a high resistance state that corresponds to a reset data state (e.g., logic 0). The data state of the memory cell can depend on whether the cell is programmed to a resistance above or below a particular level. As an additional example, various resistance variable memory cells can be programmed to one of multiple different data states corresponding to different resistance levels. Such cells may be referred to as multi state cells, multi-digit cells, and/or multilevel cells (MLCs), and can represent multiple binary digits of data (e.g., 10, 01, 00, 11, 111, 101, 100, 1010, 1111, 0101, 0001, etc.).

In some instances, a sensing operation used to determine the data state of a resistance variable memory cell can incorrectly determine the data state of the resistance variable memory cell. A memory cell can be sensed by comparing an electrical parameter of the memory cell to an electrical parameter of another memory cell or combination of memory cells that are reference memory cell(s). For example, the current flowing into the memory cell in some defined bias condition is compared to the current flowing into a reference memory cell in the same bias conditions. The memory cell is then declared to be in a logic state depending on whether the current in the memory cell is greater than or less than the current in the reference memory cell. This sensing operation can be fast and simple, but may result in sensing errors. For example, a signal associated with the memory cell during a sensing operation may or may not correspond to a data state to which the memory cell was programmed, thus resulting in sensing an incorrect data state for the memory cell.

DETAILED DESCRIPTION

Figure 1:
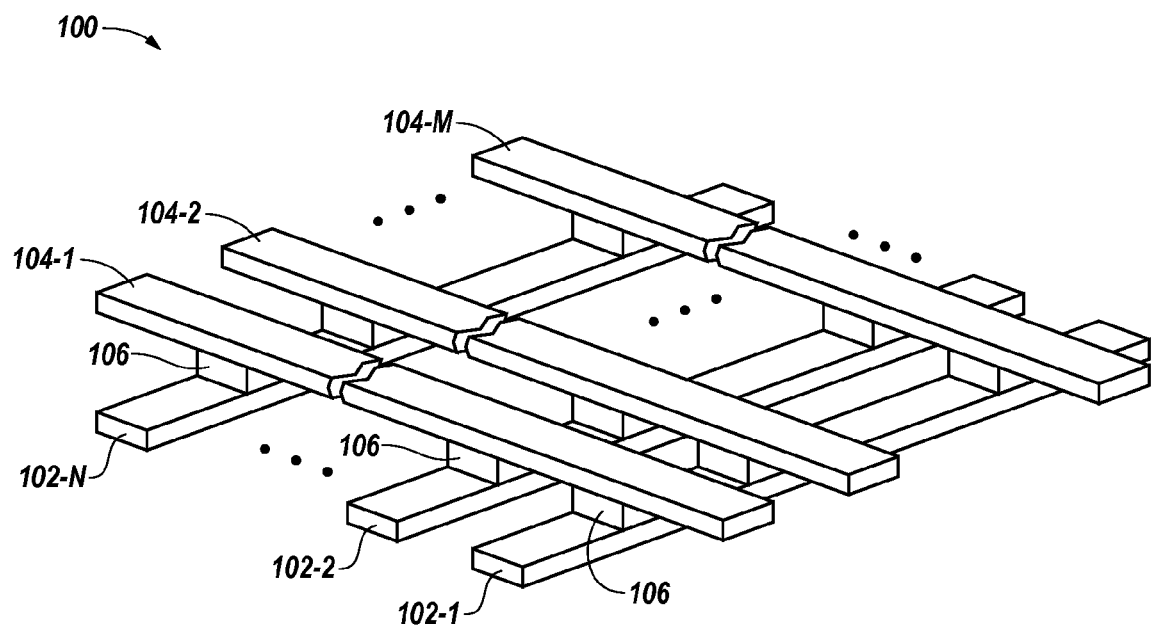
FIG. 1 is a block diagram of a portion of an array of resistance variable memory cells according to a number of embodiments of the present disclosure.

The present disclosure includes apparatuses and methods for sensing a resistance variable memory cell. A number of embodiments include programming a memory cell to an initial data state and determining a data state of the memory cell by applying a programming signal to the memory cell, the programming signal associated with programming memory cells to a particular data state, and determining whether the data state of the memory cell changes from the initial data state to the particular data state during application of the programming signal.

Embodiments described herein can, for example, reduce sensing (e.g., reading) errors and/or increase the speed of a sensing operation as compared to previous approaches. For example, sensing operations in previous approaches can result in sensing errors due to memory cells having a resistance associated with a data state other than the data state associated with the programming signal that was used to program the memory cell. Also, previous memory cell sensing approaches can include a number of steps to determine the data state of a memory cell that can be time consuming. For example, previous approaches can include sensing the data state of the memory cell, programming the memory cell to a known data state, and finally sensing the data state of the memory cell again to determine the initial data state of the memory cell. Embodiments of the present disclosure can sense memory cells with increased speed and with fewer errors than previous approaches by applying a programming signal to the memory cell and determining if a change in signal associated with the memory cell occurs.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more of such things. For example, a number of memory devices can refer to one or more memory devices. As used herein, the designators "N" and "M", particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 400 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a block diagram of a portion of an array 100 of resistance variable memory cells 106 according to a number of embodiments of the present disclosure. In the example illustrated in FIG. 1, array 100 is a cross-point array having resistance variable memory cells 106 located at the intersections of a first number of conductive lines 102-1, 102-2, . . . , 102-N (e.g., access lines, which may be referred to herein as word lines), and a second number of conductive lines 104-1, 104-2, . . . , 104-M (e.g., data/sense lines, which may be referred to herein as bit lines). As illustrated in FIG. 1, word lines 102-1, 102-2, . . . , 102-N are substantially parallel to each other and are substantially orthogonal to bit lines 104-1, 104-2, . . . , 104-M, which are substantially parallel to each other; however, embodiments are not so limited. In the embodiment illustrated in FIG. 1, resistance variable memory cells 106 can function in a two-terminal architecture (e.g., with a particular word line 102-1, 102-2, . . . , 102-N and bit line 104-1, 104-2, . . . , 104-M serving as a bottom and top electrode for the cell 106).

Each resistance variable memory cell 106 can include a storage element (e.g., a resistance variable memory element) coupled (e.g., in series) to a select device (e.g., an access device). The access device can be, for example, a diode or a transistor (e.g., a field effect transistor (FET) or bipolar junction transistor (BJT)), among others. The storage element can include a programmable portion that may have a variable resistance, for example. The memory cell 106 can be a spin torque transfer random access memory (STT RAM) cell and include magnetic tunnel junction, for example. For instance, the storage element can include one or more resistance variable materials (e.g., a material programmable to multiple different resistance states, which can represent multiple different data states) such as, for example, a transition metal oxide material, or a perovskite including two or more metals (e.g., transition metals, alkaline earth metals, and/or rare earth metals). Other examples of resistance variable materials that can be included in the storage element of resistance variable memory cells 106 can include various materials employing trapped charges to modify or alter conductivity, chalcogenides formed of various doped or undoped materials, binary metal oxide materials, colossal magnetoresistive materials, and/or various polymer based resistance variable variable materials, among others. Embodiments are not limited to a particular resistance variable material or materials. As such, resistance variable memory cells 106 can be single level and/or multilevel resistive random access memory (RRAM) cells, spin torque transfer random access memory (STT RAM) cells, programmable conductor memory cells, phase change random access memory (PCRAM) cells, magnetoresistive random access memory cells, and/or conductive-bridging random access memory (CBRAM) cells, among various other types of resistance variable memory cells.

In operation, resistance variable memory cells 106 of array 100 can be programmed via programming signals (e.g., write voltage and/or current pulses) applied to the cells (e.g., the storage element of the cells) via selected word lines 102-0, 102-1, . . . , 102-N and bit lines 104-0, 104-1, . . . , 104-M. The amplitude (e.g., magnitude), duration (e.g., width), and/or number of programming pulses, for example, applied to resistance variable memory cells 106 can be adjusted (e.g., varied) in order to program the cells to one of a number of different resistance levels corresponding to particular data states.

In a number of embodiments, a single level resistance variable memory cell may be programmed to one of two data states (e.g., logic 1 or 0). The memory cell may be programmed with a first programming signal, which will place the cell in a low resistance data state (e.g., logic 1) or the memory cell may be programmed with a second programming signal, which will place the cell in a relatively higher resistance data state (e.g., logic 0). In a number of embodiments, the difference in resistance between the low data resistance state and the high resistance data state of a memory cell can be referred to as the reading window. For example, a memory cell in the high resistance data state can have a resistance that is 10 times more that the resistance of the memory cell in the low resistance data state, therefore the programming window for the memory cell can be 10 times the low resistance level. Embodiments in the present disclosure are not limited to a particular reading window and the reading window can include a number of differences in resistance between a high resistance data state and a low resistance data state.

A sensing (e.g., read and/or program verify) operation can be used to determine the data state of a resistance variable memory cell 106 (e.g., the resistance state of the storage element of a resistance variable memory cell 106) by sensing (e.g., read) a signal, for example, on a bit line 104-0, 104-1, . . . , 104-M associated with the respective cell responsive to a particular voltage applied to the selected word line 102-0, 102-1, . . . , 102-N to which the selected cell is coupled. Sensing the signal associated with the respective cell can include sensing a voltage, a current, an amplitude, and/or a slope (e.g. a time derivative of a parameter of the signal) of the signal, among other characteristics of the signal. In a number of embodiments where a memory cell includes a 3-terminal select device, a word line voltage can be used to select the memory cell and a signal through memory cell can be changed by voltage difference between a bit line and a source of the selected memory cell to vary the resistance level of the memory cell, for example. A sensing operation can incorrectly determine the data state of a resistance variable memory cell when the resistance associated with the memory cell during the sensing operation corresponds approximately to a resistance associated with a data state that is different from the data state associated with the programming signal that was used to program the memory cell to an initial state.

A sensing operation according to a number of embodiments of the present disclosure can reduce sensing errors associated with a cell having a resistance associated with two or more data states and/or decrease the time to perform a sensing operation. Previous approaches included sensing operations that resulted in sensing errors or reduced sensing errors, but involved a number of time intensive steps that include two sensing operations and a programming operation to determine the data state of the memory cell. In a number of embodiments, a method for sensing a resistance variable memory cell can include applying a programming signal to the memory cell and determining the data state of the memory cell by determining whether the data state of the memory cell changes while applying the programming signal. Changes in the data state of the memory while applying the programming signal can be determined by using a change determination component to determine if a change in the signal associated with the memory cell occurred while applying the programming signal. For example, determining the data state of the memory cell can include determining that the data state of the memory cell is a data state associated with the programming signal applied to the memory cell when the determined change in the signal associated with the memory cell is less than a threshold amount and determining that the data state of the memory cell is a data state different from the data state associated with the programming signal applied to the memory cell when the determined change in the signal associated with the memory cell is greater than or equal to a threshold amount.

In a number of embodiments, a method for sensing a resistance variable memory cell can include applying a programming signal to the memory cell and determining the data state of the memory cell by determining whether the data state of the memory cell changes from an initial data state by comparing a first sensed signal associated with the memory cell responsive to the applied programming signal to a second sensed signal associated with the memory cell responsive to the applied programming signal. The first sensed signal can be sensed during a first time period. The first time period can include the time from when the programming signal is first applied to the memory cell to a time $T_{wmin}$. $T_{wmin}$ can be a time that is less than an amount of time that a memory cell takes to switch resistance levels. The second time period can include a time period after time $T_{wmax}$. $T_{wmax}$ can be a time that is greater than an amount of time that a memory cell takes to switch resistance levels. For example, determining the data state of the memory cell can include determining that the data state of the memory cell is the data state associated with the applied programming signal when a difference between the first sensed signal and the second sensed signal is less than a threshold amount and determining that the data state of the memory cell is a data state that is different than the data state associated with the applied programming signal when a difference between the first sensed signal and the second sensed signal is greater than or equal to a threshold amount.

Figure 2:
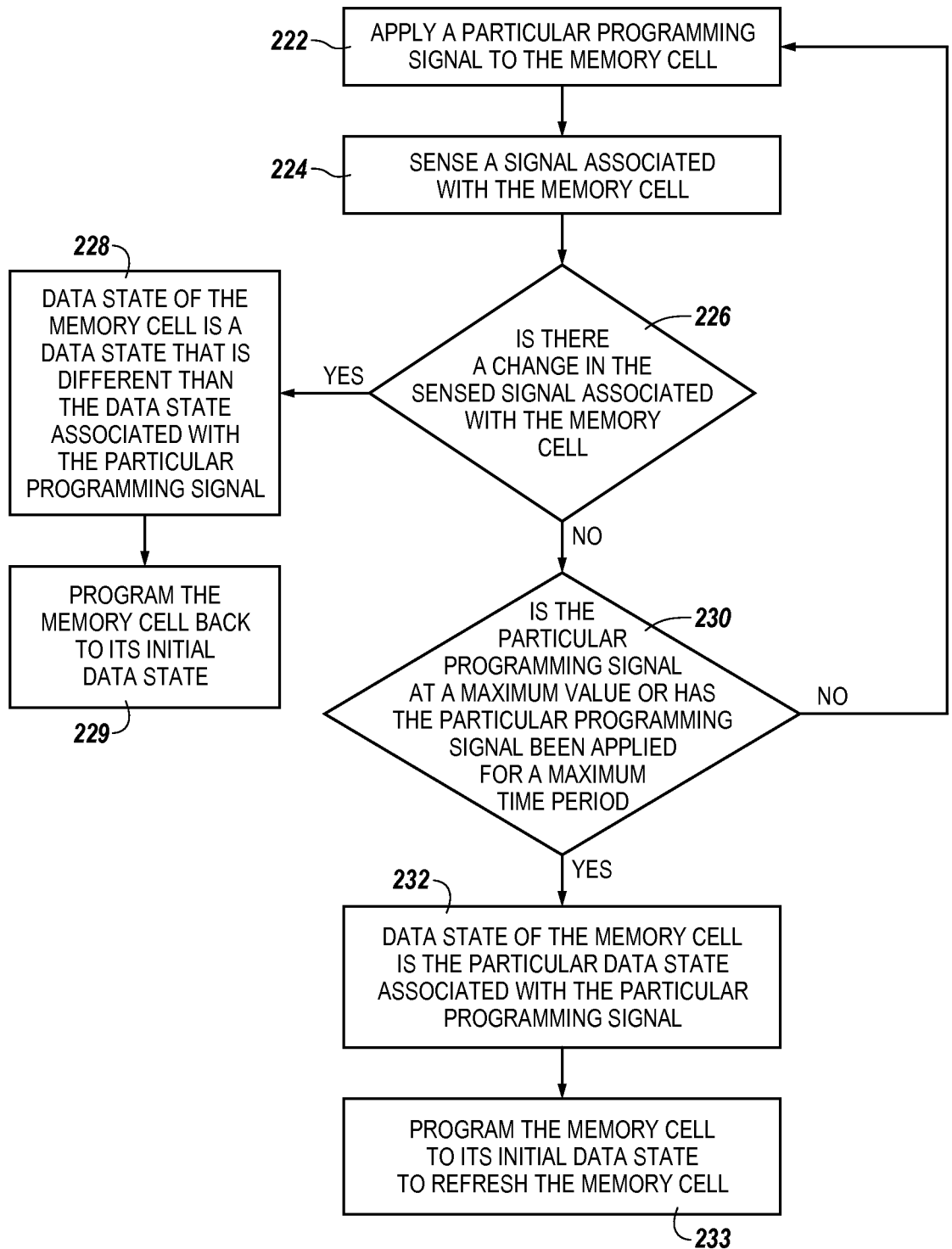
FIG. 2 illustrates a method for determining a data state of resistance variable memory cells according to a number of embodiments of the present disclosure.

FIG. 2 illustrates a method for determining a data state of resistance variable memory cells according to a number of embodiments of the present disclosure. In FIG. 2, the method includes using a change determination component to determine if changes in the signal associated with the memory cell occur while a particular programming signal is applied to the memory cell. The method can be used when the memory cell has been programmed to an initial data state. At 222, the method of determining the data state (e.g., read operation) begins.

As shown at 222, the method includes applying a particular programming signal to the memory cell. At 224, the method includes sensing a signal associated with the memory cell. In a number of embodiments, the signal associated with the memory cell is sensed while the programming signal is applied to the memory cell. The sensed signal associated with the memory cell can be monitored to determine whether a change occurs. At 226, it is determined whether a change in the sensed signal occurs. In an example in which the memory cell is an STT memory cell, the particular programming signal can be a programming signal used to program the memory cell to a parallel state. As shown at 228, if a change in the sensed signal associated with the memory cell occurred, the data state of the memory cell is a data state that is different than the data state associated with the particular programming signal (e.g., an anti-parallel state). For instance, an occurrence of a change in the sensed signal may be determined if the initial data state of the memory cell is an anti-parallel data state and the particular programming signal is a programming signal used to program memory cells to a parallel state; therefore, determining that a change in the signal associated with the memory cell occurred would indicate that the memory cell is not at the particular data state (e.g., parallel data state), but at a different data state (e.g. anti-parallel data state). A sensed signal change can indicate a data state change for the memory cell during the application of the programming signal and as shown at 229, the memory cell can be programmed back to its initial state. For example, a programming signal associated with programming memory cells to the anti-parallel data state can be applied to the memory cell to return the memory cell to the initial data state.

As indicated at 230, if there is not a change in the sensed signal associated with the memory cell, a determination is made as to whether the particular programming signal is at a maximum value or whether the particular programming signal has been applied to the memory cell for a maximum time period. As shown at 232, if the particular programming signal is at the maximum value or the particular programming signal has been applied to the memory cell for a maximum time period, the data state of the memory cell is the particular data state associated with the particular programming signal. If the particular programming signal is not at the maximum value and the particular programming signal has not been applied to the memory cell for a maximum time period, the particular programming signal is continued to be applied to the memory cell. In a number of embodiments, when the particular programming signal is continued to be applied to the memory cell, the voltage or current of the particular programming signal can be ramped. For example, during implementation of the method illustrated in FIG. 2, the particular programming signal can be incrementally ramped through a number of programming signal values that are used to program memory cells to the particular data state. The particular programming signal can be incrementally ramped until a determination that a change in the signal associated with the memory cell occurred, a maximum programming signal value is reached, or a maximum time period for applying the particular programming signal is reached. A change in the sensed signal may not occur if the initial data state of the memory cell is a parallel data state and the particular programming signal is associated with programming memory cells to a parallel state, therefore the lack of a change in the signal associated with the memory cell would indicate that the memory cell is in the particular data state (e.g., parallel data state). Once it has been determined that the data state of the memory cell is the particular data state associated with the particular programming signal, the memory cell does not have to reprogrammed and can be left to remain in the particular data state, or as shown at 233, the memory cell can be programmed to its initial data state (e.g., the particular data state) to refresh the memory cell.

In a number of embodiments, a threshold value can be used to determine whether a change in the signal associated with the memory cell occurred, wherein a change that is less than the threshold value indicates the memory cell is in the data state associated with the particular programming signal and a change that is greater than or equal to the threshold value indicates the memory cell is in a data state that is different than the data state associated with the particular programming signal.

Figure 3:
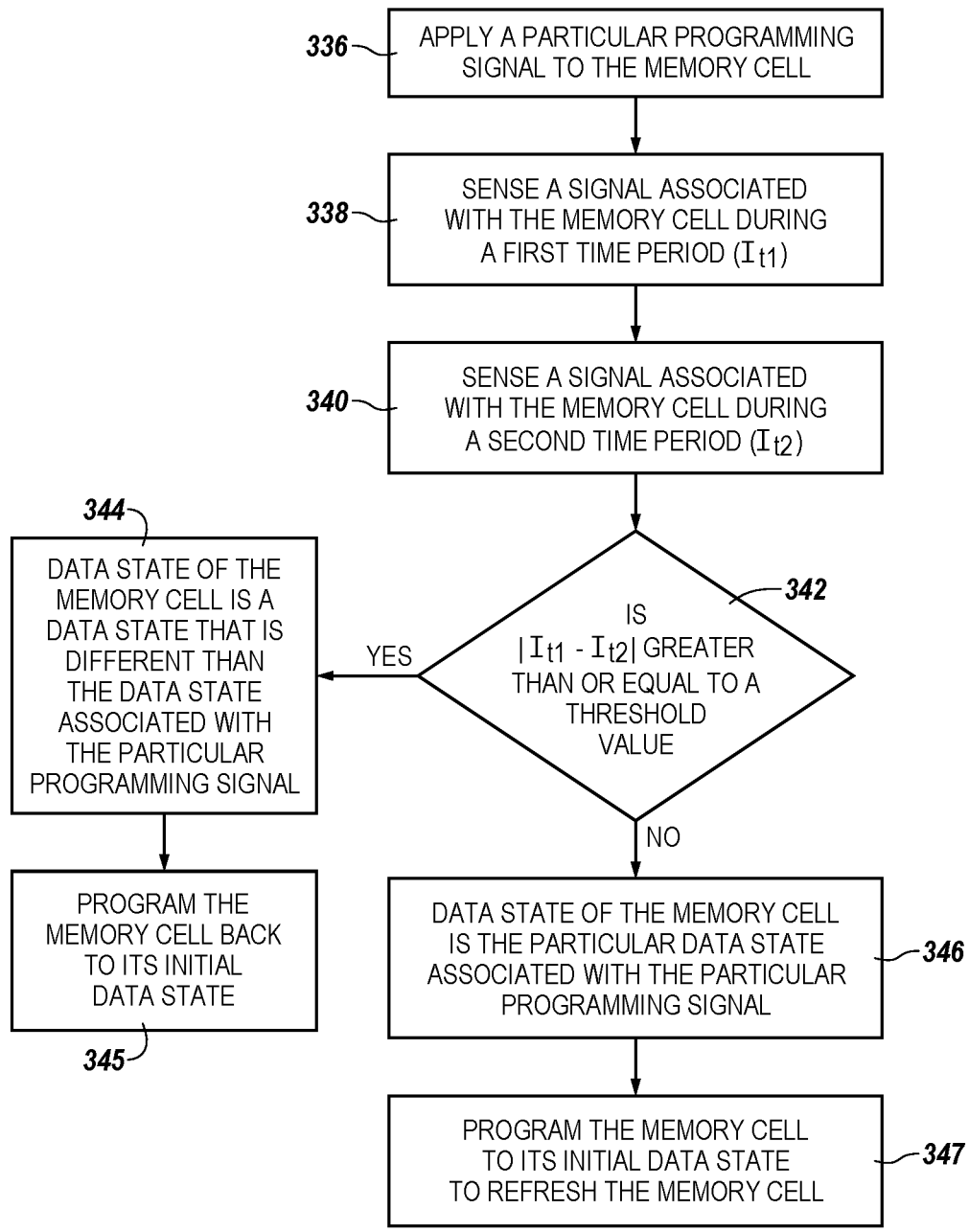
FIG. 3 illustrates a method for determining a data state of resistance variable memory cells according to a number of embodiments of the present disclosure.

FIG. 3 illustrates a method for determining a data state of resistance variable memory cells according to a number of embodiments of the present disclosure. In FIG. 3, the method includes using a change determination component to determine if there is a difference between a sensed signal associated with the memory cell during a first time period and a sensed signal associated with the memory cell during a second time period. The method can be used when the memory cell has been programmed to an initial data state. At 336, the method of determining the data state (e.g., read operation) begins.

As shown at 336, the method includes applying a particular programming signal to the memory cell. At 338, the method includes sensing a signal associated with the memory cell during a first time period to determine a first signal ($S_{t1}$). At 340, the method includes sensing a signal associated with the memory cell during a second time period to determine a second signal ($S_{t2}$). For example, the particular programming signal can be a programming signal associated with programming memory cells to a parallel state. In a number of embodiments, the signal is sensed during the first time period and the second time period while the programming signal is applied to the memory cell. As shown at 342, the first and second sensed signals are compared to determine if the absolute value of the difference between the first signal ($Si_{t1}$) and the second signal ($S_{t2}$) is greater than or equal to a threshold value. At 344, if the absolute value of the difference between the first signal ($S_{t1}$) and the second signal ($Si_{t2}$) is greater than or equal to a threshold value, the data state of the memory cell is a data state that is different than the data state associated with the particular programming signal and as shown at 345, the memory cell can be programmed back to its initial state. In an example in which the memory cell is an STT memory cell, it can be determined that an absolute value of the difference between the first signal ($S_{t1}$) and the second signal ($Si_{t2}$) is greater than or equal to a threshold value if the initial data state of the memory cell is an anti-parallel data state and the particular programming signal is a programming signal used to program the memory cell to a parallel state, therefore the determined difference in the first signal and the second signal associated with the memory cell would indicate that the memory cell is not at the particular data state (e.g., parallel data state), but at a different data state (e.g. anti-parallel data state). A programming signal associated with programming memory cells to the anti-parallel data state can be applied to the memory cell to return the memory cell to the initial state.

At 346, if the absolute value of the difference between the first signal ($S_{t1}$) and the second signal ($S_{t2}$) is less than a threshold value, the data state of the memory cell is the particular data state associated with the particular programming signal. In an example in which the memory cell is an STT memory cell, it can be determined that an absolute value of the difference between the first signal ($S_{t1}$) and the second signal ($Si_{t2}$) is less than a threshold value if the initial data state of the memory cell is a parallel data state and the particular programming signal is a programming signal used to program the memory cell to a parallel state, therefore the determined difference in the first signal and the second signal associated with the memory cell would indicated that the memory cell is at the particular data state (e.g., parallel data state). Once it has been determined that the data state of the memory cell is the particular data state associated with the particular programming signal, the memory cell does not have to reprogrammed and can be left to remain in the particular data state, or as shown at 347, the memory cell can be programmed to its initial data state (e.g., the particular data state) to refresh the memory cell.

Figure 4:
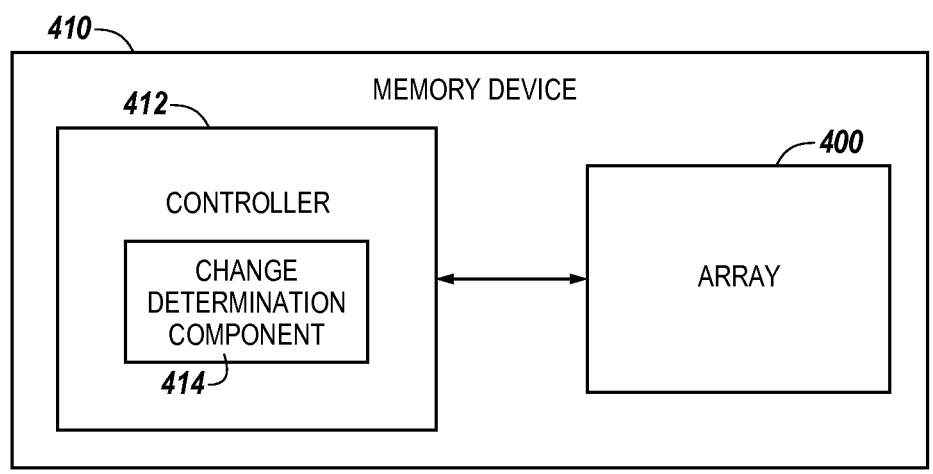
FIG. 4 illustrates a block diagram of an apparatus in the form of a memory device according to a number of embodiments of the present disclosure.

FIG. 4 illustrates a block diagram of an apparatus in the form of a memory device 410 according to a number of embodiments of the present disclosure. As shown in FIG. 4, memory device 410 includes a controller 412 coupled to a memory array 400. As used herein, a memory system, a controller, or a memory device might also be separately considered an "apparatus." An "apparatus" can refer to, but is not limited to, any of a variety of structures or combinations of structures, such as a circuit or circuitry, a die or dice, a module or modules, a device or devices, or a system or systems, for example.

Memory array 400 can be analogous to, for example, memory array 100 previously described in connection with FIG. 1. Although one memory array is shown in FIG. 4, embodiments of the present disclosure are not so limited (e.g., memory device 410 can include more than one memory array coupled to controller 412).

Controller 412 can include, for example, control circuitry and/or firmware. Controller 412 can be included on the same physical device (e.g., the same die) as memory array 400, or can be included on a separate physical device that is communicatively coupled to the physical device that includes memory array 400. For example, controller 412 can be a controller of an array testing apparatus (e.g., a controller used to perform testing operations on memory arrays such as array 400).

In one example, controller 412 includes a change determination component 414. Change determination component 414 can include control circuitry and/or firmware to determine changes and/or differences in sense signals associated with memory cells in array 400. Change determination component 414 can be included on the same physical device (e.g., the same die) as memory array 400, or can be included on a separate physical device that is communicatively coupled to the physical device that includes memory array 400. Circuitry associated with a number of example change determination components 414 are illustrated in FIGS. 5A-5C and will be described in more detail below.

Controller 412 can apply a number of signals in accordance with a number of embodiments of the present disclosure to the memory cells (e.g., to the storage elements of the memory cells) in memory array 400. For example, controller 412 can apply a programming signal previously described in connection with FIG. 1 to the storage element of the memory cells in memory array 400.

The embodiment illustrated in FIG. 4 can include additional circuitry that is not illustrated so as not to obscure embodiments of the present disclosure. For example, memory device 410 can include address circuitry to latch address signals provided over I/O connectors through I/O circuitry. Address signals can be received and decoded by a row decoder and a column decoder, to access memory array 400. As an additional example, memory device 410 can include sense (e.g., read) circuitry (e.g., circuitry in addition to change determination component 414).

Figure 5A:
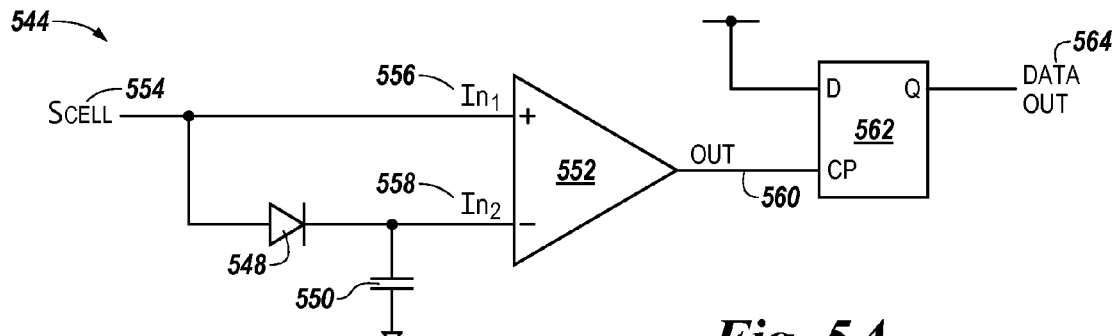
FIGS. 5A-5C illustrate example change determination components according to a number of embodiments of the present disclosure.
Figure 5B:
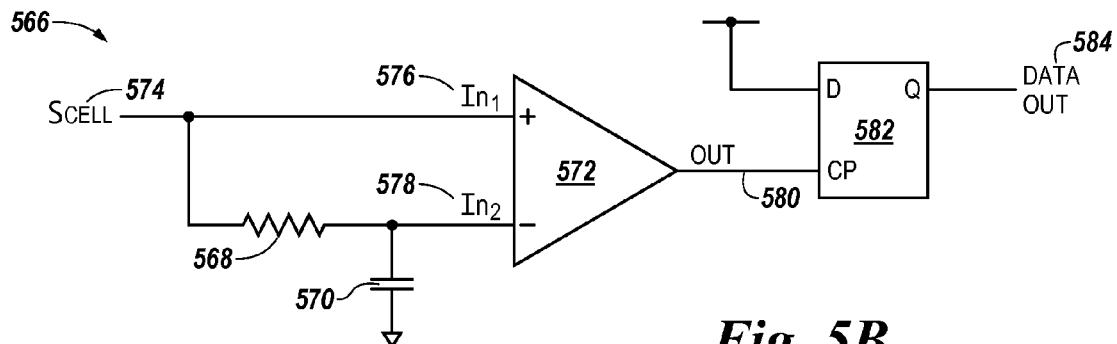
Figure 5C:
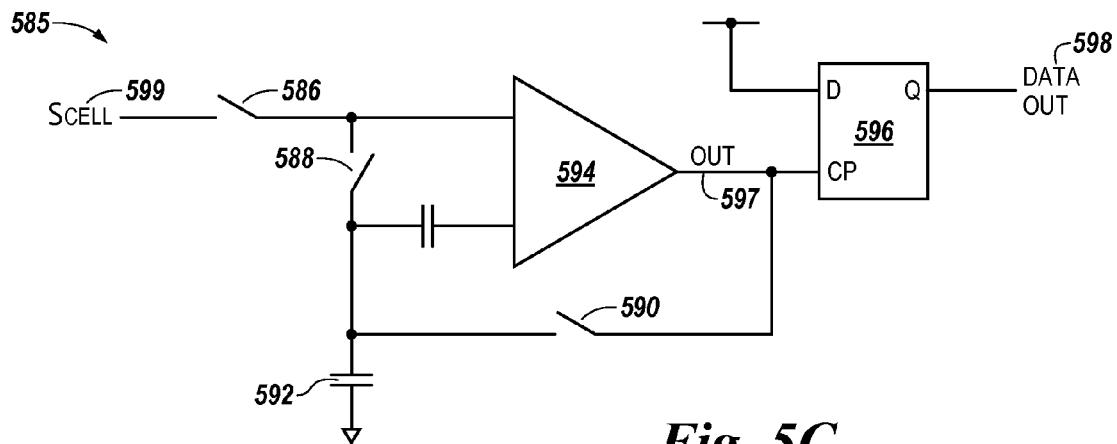

FIGS. 5A-5C illustrate example change determination components according to a number of embodiments of the present disclosure. In FIG. 5A, change determination component 549 can be used to determine whether a change in a signal associated with a memory cell occurred while a particular programming signal is applied to the memory cell. Change determination component 549 includes a diode 548, a capacitor 550, a comparator 552, and a latch 562. Comparator 552 can be used to determine if changes in signal 554 ($S_{cell}$) occur by comparing input 556 ($In_1$) and input 558 ($In_2$) to each other. Input 556 includes signal 554 directly from the cell and input 558 includes a signal after signal 554 has passed through diode 548 and charged capacitor 550. Output 560 (Out) from comparator 552 can be input into latch 562 to determine the data state of the memory cell. The output 564 (Data Out) of latch 562 can indicate whether the data state of the memory cell changed due to the programming signal. As such, if the output 564 indicates the data state changed, the memory cell can be reprogrammed to its initial data state.

In FIG. 5B, change determination component 566 can be used to determine if change in a signal associated with a memory cell occur while a particular programming signal is applied to the memory cell. Change determination component 566 includes a resistor 568, a capacitor 570, a comparator 572, and a latch 582. Comparator 572 can be used to determine if changes in signal 574 ($S_{cell}$) occur by comparing input 576 ($In_1$) and input 578 ($In_2$) to each other. Input 576 includes signal 574 directly from the cell and input 578 includes a signal after signal 554 has passed through resistor 568 and charged capacitor 570. Output 580 (Out) from comparator 572 can be input into latch 582 to determine the data state of the memory cell. The output 584 (Data Out) of latch 582 can indicate whether the data state of the memory cell changed due to the programming signal. As such, if the output 584 indicates the data state changed, the memory cell can be reprogrammed to its initial data state.

In FIG. 5C, change determination component 585 can be used to determine if a change in signal associated with a memory cell occurs while a particular programming signal is applied to the memory cell. In FIG. 5C, change determination component 585 can be used to determine differences between a signal associated with a memory cell during a first time period and a signal associated with a memory cell during a second time period when a particular programming signal is applied to the memory cell. An auto-zero phase to minimize the offset of the comparator 594 is completed before a sensing operation begins by closing switch 588 and switch 590 and opening switch 586. In a number of embodiments, during a first time period a signal 599, $S_{cell}$, associated with a cell is applied to circuitry 585, with switch 586 and switch 588 activated and switch 590 not activated, to sample the a voltage associated with signal 599 on capacitor 592. During a second time period, signal 599 associated with the cell is applied to circuitry 585, with switch 586 activated and switch 588 and switch 590 not activated. Comparator 594 compares the signal 599 applied to the circuitry 585 during the first time period and the signal 599 applied to the circuitry 585 during the second time period and output 597 (Out) from comparator 594 can be input into latch 596 to determine the data state of the memory cell. The output 598 (Data Out) of latch 596 can indicate whether the data state of the memory cell changed due to the application of the programming signal. As such, if the output 598 indicates the data state changed, the memory cell can be reprogrammed to its initial data state.

In a number of embodiments, the circuitry illustrated in FIGS. 5A-5C can be included in a controller, such as controller 412 illustrated in FIG. 4, and/or an array of memory cells, such as array 400 illustrated in FIG. 4. Embodiments of the present disclosure are not limited to the circuitry illustrated in FIGS. 5A-5C.

CONCLUSION

The present disclosure includes apparatuses and methods for sensing a resistance variable memory cell. A number of embodiments include programming a memory cell to an initial data state and determining a data state of the memory cell by applying a programming signal to the memory cell, the programming signal associated with programming memory cells to a particular data state, and determining whether the data state of the memory cell changes from the initial data state to the particular data state during application of the programming signal.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of the associated listed items.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for sensing a resistance variable memory cell, comprising:
    applying a programming ramp signal to the memory cell, wherein the programming signal is a signal that is used to program the memory cell to a particular resistance state and is of a sufficient magnitude to program the memory cell to the particular resistance state,
    sensing a signal associated with the memory cell while the programming signal is being applied to the memory during a first time period;
    sensing a signal associated with the memory cell while the programming signal is being applied to the memory during a second time period; and
    determining a resistance state of the memory cell based on the signals sensed during the first time period and during the second time period by comparing the signals sensed during the first time period and during the second time period.

2. The method of claim 1, wherein determining whether the resistance state of the memory cell changes from the initial resistance state to the particular resistance state includes determining whether the resistance state of the memory cell changed from an anti-parallel state to a parallel state.

3. The method of claim 1, wherein determining the resistance state of the memory cell includes determining that the resistance state of the memory cell is the particular resistance state if application of the programming signal does not change the resistance state of the memory cell from the initial resistance state to the particular resistance state.

4. The method of claim 1, wherein the method includes programming the memory cell from the particular resistance state back to the initial resistance state if it is determined that application of the programming signal changed the resistance state of the memory cell from the initial resistance state to the particular resistance state.

5. The method of claim 1, wherein the method includes determining the resistance state of the memory cell via a controller coupled to the memory cell.

6. The method of claim 1, wherein determining the resistance state of the memory cell based on the signals sensed during the first time period and during the second time period includes determining a change in the slope of an electrical characteristic between the signal sensed during the first time period and the signal sensed during the second time period.

7. An apparatus, comprising:
    a controller coupled to a resistance variable memory cell and configured to:
    determine a resistance state of the memory cell by:
    applying a programming ramp signal to the memory cell, wherein the programming signal is a signal that is used to program the memory cell to a particular resistance state and is of a sufficient magnitude to program the memory cell to the particular resistance state; and
    determining whether the resistance state of the memory cell changes from an initial resistance state to the particular resistance state during application of the programming signal, by comparing a first sensed signal associated with the memory cell responsive to the applied programming signal to a second sensed signal associated with the memory cell responsive to the applied programming signal.

8. The apparatus of claim 7, wherein determining whether the resistance state of the memory cell changes from the initial resistance state to the particular resistance state includes determining whether the resistance state of the memory cell changed from an anti-parallel state to a parallel state.

9. The apparatus of claim 7, wherein determining the resistance state of the memory cell includes determining that the resistance state of the memory cell is the particular resistance state when a difference between the first sensed signal and the second sensed signal is less than a threshold amount.

10. The apparatus of claim 7, wherein determining whether the resistance state of the memory cell changes from the initial resistance state to the particular resistance state includes using a change determination component to determine a change in signal associated with the memory cell.

11. The apparatus of claim 7, wherein determining the resistance state of the memory cell includes determining that the resistance state of the memory cell is the particular resistance state when a determined change between the first sensed signal and the second sensed signal is less than a threshold amount.

12. The apparatus of claim 7, wherein determining the resistance state of the memory cell includes determining that the resistance state of the memory cell is a resistance state different from the particular resistance state when a determined change between the first sensed signal and the second sensed signal is greater than or equal to a threshold amount.

13. An apparatus, comprising:
    a controller coupled to a resistance variable memory cell and configured to control:
    determining a resistance state of the memory cell by:
    applying a programming ramp signal to the memory cell, wherein the programming signal is a signal that is used to program the memory cell to a particular resistance state and is of a sufficient magnitude to program the memory cell to the particular resistance state;
    comparing a signal associated with the memory cell during a first time period to a signal associated with the memory cell during a second time period while the programming signal is applied to the memory cell; and
    determining whether the resistance state of the memory cell changes from an initial resistance state to a particular resistance state during application of the programming signal.

14. The apparatus of claim 13, wherein the controller is configured to control sensing the signal associated with the memory cell during the first time period and sensing the signal associated with the memory cell during the second time period.

15. The apparatus of claim 13, wherein the controller is configured to determine the memory cell is in the particular resistance state if the signal associated with the memory cell during the first time period is different than the signal associated with the memory cell during the second time period by less than a threshold amount.

16. The apparatus of claim 13, wherein the controller is configured to determine the memory cell is in a resistance state different from the particular resistance state if the signal associated with the memory cell during the first time period is different than the signal associated with the memory cell during the second time period by greater than or equal to a threshold amount.

17. The apparatus of claim 13, wherein the controller is configured to control applying a programming signal associated with programming memory cells to a resistance state different from the particular resistance state when the signal associated with the memory cell during the first time period is different than the signal associated with the memory cell during the second time period by greater than or equal to a threshold amount.

18. The apparatus of claim 13, wherein comparing the signal associated with the memory cell during the first time period to the signal associated with the memory cell during the second time period includes using a change determination component.

19. The apparatus of claim 13, wherein the change determination component includes a first capacitor, a second capacitor, and a comparator.

\* \* \* \* \*